(12) United States Patent
Yanagisawa et al.

(10) Patent No.: US 6,303,511 B2
(45) Date of Patent: *Oct. 16, 2001

(54) WAFER FLATTENING PROCESS

(75) Inventors: Michihiko Yanagisawa; Takeshi Sadohara, both of Ayase (JP)

(73) Assignee: SpeedFam-IPEC Co., Ltd., Ayase (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/392,131

(22) Filed: Sep. 8, 1999

(30) Foreign Application Priority Data

Feb. 12, 1999 (JP) .................................. 11-034305

(51) Int. Cl.⁷ .................................. H01L 21/302
(52) U.S. Cl. ...................... 438/710; 438/711; 438/712; 438/719
(58) Field of Search .................... 438/710, 711, 438/719, 712

(56) References Cited

U.S. PATENT DOCUMENTS 4,668,337 * 5/1987 Sekine et al. ........................ 156/643
4,876,983 * 10/1989 Fukuda et al. ...................... 118/722

FOREIGN PATENT DOCUMENTS 6-5567 A * 1/1994 (JP) ............................ H01L/21/302
6-5571 A * 1/1994 (JP) ............................ H01L/21/302

* cited by examiner

Primary Examiner—Robert Kunemund
Assistant Examiner—Charlotte A. Brown
(74) Attorney, Agent, or Firm—Burr & Brown

(57) ABSTRACT

A wafer flattening process for improving the microroughness of a wafer by local etching while maintaining a distance between a plasma discharge location and the wafer surface at a predetermined value. By executing a plasma generating step, $SF_6$ gas in a gas cylinder 31 is fed to the inside of an alumina discharge tube 2, then plasma discharge of the $SF_6$ gas is caused by a plasma generator 1 to produce an activated species gas G and which is locally sprayed from a nozzle portion 20 of the alumina discharge tube 2 to the surface of the silicon wafer W. In this state, by performing a local etching step, the surface of the silicon wafer W is flattened. At this time, the distance from the approximate center of the plasma discharge location to the surface of the silicon wafer W is set to a distance larger than 3000 times the mean free path of the ions in the activated species gas G and smaller than 6000 times. Due to this, the ions in the activated species gas G are extinguished before being sprayed from the nozzle portion 20 and therefore the surface of the silicon wafer W is etched by only the neutral radicals without being damaged.

2 Claims, 4 Drawing Sheets

WAFER FLATTENING PROCESS

BACKGROUND OF THE INVENTION

1. Field of the Invention

The present invention relates to a wafer flattening process for etching and flattening a projecting portion of a wafer surface locally by an activated species gas or a process for locally etching a relatively thick portion of a wafer to achieve a uniform distribution of thickness of the wafer.

2. Description of the Related Art

FIG. 6 is a schematic cross-sectional view of a local etching apparatus for showing an example of a wafer flattening process of the related art.

In FIG. 6, reference numeral 100 is a plasma generator. Activated species gas G in the plasma generated by the plasma generator 100 is sprayed on the front surface of a silicon wafer W from a nozzle portion 101.

The silicon wafer W is placed and secured on a stage 120. The stage 120 is made to move in the horizontal direction to guide a portion relatively thicker than a prescribed thickness on the surface of the silicon wafer W (hereinafter referred to as a "relatively thick portion") directly under the nozzle portion 101.

The activated species gas G is then sprayed from the nozzle portion 101 to the projecting relatively thick portion Wa to locally etch the relatively thick portion Wa and achieve a uniform distribution of thickness of the surface of the silicon wafer W and thereby flatten the surface of the silicon wafer W.

The above wafer flattening method of the related art, however, suffered from the following problem.

The activated species gas G sprayed from the nozzle portion 101 included a large number of ions in addition to the neutral radicals. These ions also struck the silicon wafer W, so the portions where the ions struck were seriously damaged. As a result, the micro-roughness of the silicon wafer W increased.

SUMMARY OF THE INVENTION

The present invention was made to solve the above problem and has as its object to provide a wafer flattening process for improving the micro-roughness of a wafer by performing local etching while maintaining a predetermined distance between a plasma discharge location and wafer surface.

To achieve the above object, according to an aspect of the invention, there is provided a wafer flattening process comprising a plasma generating step for causing plasma discharge of a predetermined gas in a discharge tube to produce an activated species gas and spraying that activated species gas from a nozzle portion of the discharge tube and a local etching step for locally etching a relatively thick portion present on the surface of a wafer by the activated species gas sprayed from the nozzle portion while moving the nozzle portion of the discharge tube relatively along the surface of the wafer, wherein the distance from an approximate center of a plasma discharge location of a predetermined gas to the surface of wafer is set to at least a distance whereby the ions in the activated species gas are extinguished by repeated collision within the activated species gas or their lifetime and whereby the etching depth of the wafer becomes substantially a desired value.

Due to this configuration, by executing the plasma generating step, plasma discharge of a predetermined gas in the discharge tube is caused to produce an activated species gas which is then sprayed from the nozzle portion of the discharge tube. By executing the local etching step next, the nozzle portion of the discharge tube is made to move relatively along the surface of the wafer so that a relatively thick portion present on the surface of the wafer is locally etched by the activated species gas sprayed from the nozzle portion. By executing this step over the entire wafer, the entire surface of the wafer is flattened. However, a large number of ions are present in the activated species gas. Therefore, when the activated species gas is sprayed on to the wafer, the ions inflict damage on the wafer surface and the micro-roughness of the wafer increases. In the present invention, however, since the distance from the approximate center of the plasma discharge location of the predetermined gas to the surface of the wafer is set to at least a distance whereby the ions in the activated species gas are extinguished by repeated collision in the activated species gas or their lifetimes, the ions are extinguished before reaching the wafer surface and only neutral radicals are sprayed on the wafer surface. This being said, if the distance from the approximate center of the plasma discharge location to the wafer surface is too large, the amount of the neutral radicals reaching the wafer is reduced and the desired etching shape cannot be obtained. In the present invention, however, since the distance is set to a distance whereby an etching depth of the wafer by the activated species gas becomes an approximately desired value, it is possible to obtain the desired etching shape.

Any gas may be used for the plasma discharge, but as an example, according to an embodiment of the invention, the predetermined gas is one of a gas of a halogen compound or a mixed gas including a halogen compound and where the distance from the approximate center of the plasma discharge location to the surface of the wafer is a distance larger than 3000 times a mean free path of the ions produced in the activated species gas and smaller than 6000 times. As a specific example, according to an embodiment of the invention, the halogen compound is one of sulfur hexafluoride, carbon tetrafluoride, or nitrogen trifluoride.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, an embodiment of the present invention will be explained with reference to the drawings.

Figure 1:
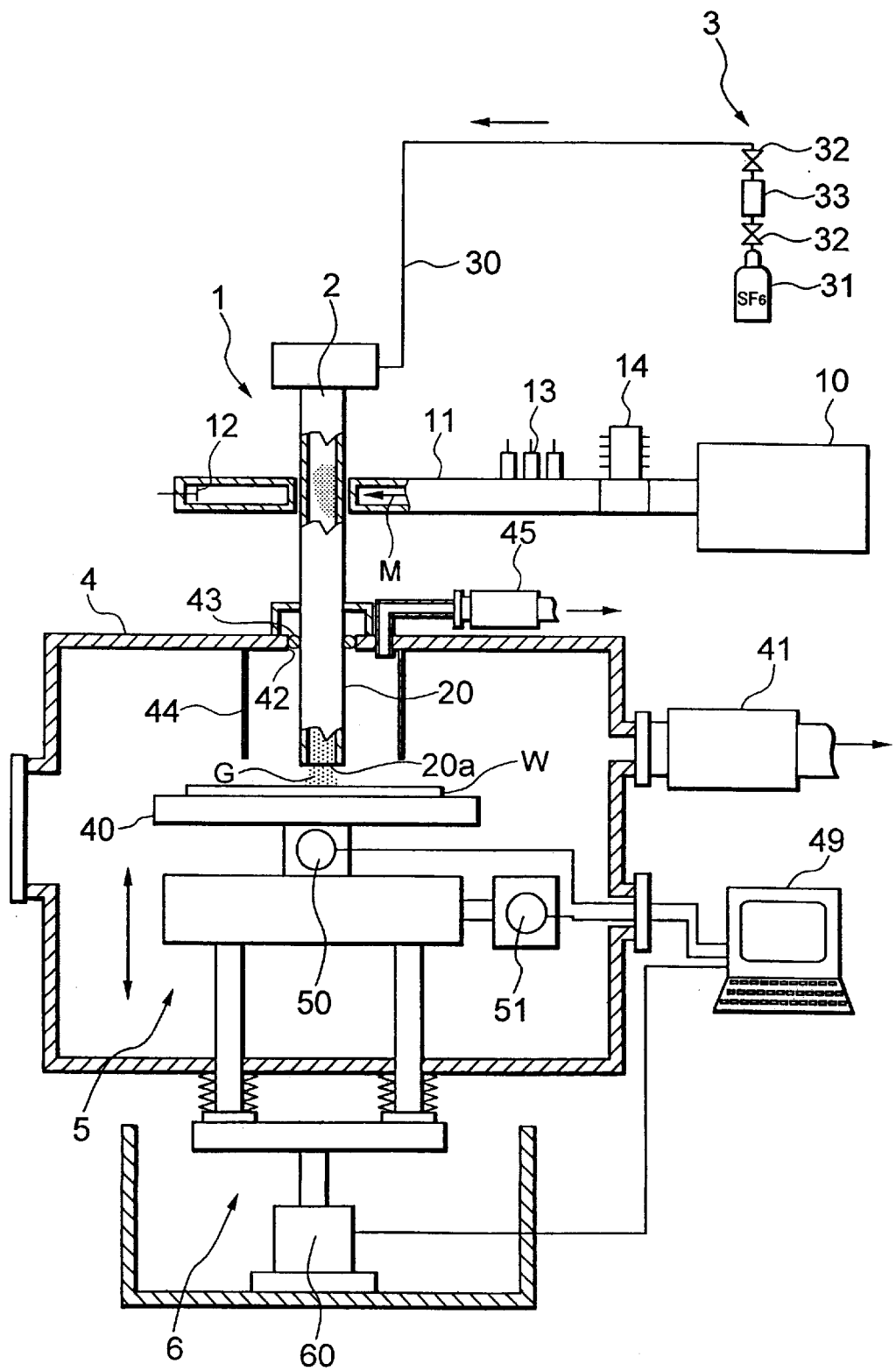
FIG. 1 is a schematic view of the configuration of a local etching apparatus for working the wafer flattening process according to an embodiment of the present invention.

FIG. 1 is a schematic view of the configuration of a local etching apparatus for working the wafer flattening process according to an embodiment of the present invention.

As shown in FIG. 1, the local etching apparatus is provided with a plasma generator 1, an alumina discharge tube 2, a gas feeder 3, an X-Y drive 5, and a Z-drive 6.

The plasma generator 1 is a device for causing plasma discharge of gas inside the alumina discharge tube 2 to produce radicals and is comprised of a microwave generator 10 and a waveguide 11.

The microwave generator 10 is a magnetron and can generate a microwave M of a predetermined frequency.

The waveguide 11 is for guiding the microwave M generated by the microwave generator 10 and is fit over the alumina discharge tube 2.

At the inside of the left end of the waveguide 11 is attached a reflection plate (short plunger) 12 for reflecting the microwave M to form a standing wave. Further, in the middle of the waveguide 11 are attached a 3-stub tuner 13 for phase alignment of the microwave M and an isolator 14 for bending the reflected microwave M heading toward the microwave generator 10 90° in direction (surface direction of FIG. 1).

The alumina discharge tube 2 is a cylinder having a nozzle portion 20 at its lower end and is connected at its upper end to a feed pipe 30 of the gas feeder 3.

The gas feeder 3 is a device for feeding gas into the alumina discharge tube 2 and has a $SF_6$ (sulfur hexafluoride) gas cylinder 31. The gas cylinder 31 is connected to the feed pipe 30 through a valve 32 and flow rate controller 33.

By adopting this configuration for the plasma generator 1, when a gas is fed from the gas feeder 3 to the alumina discharge tube 2 and a microwave M is generated from the microwave generator 10, plasma discharge is caused in the alumina discharge tube 2 and activated species gases G produced by the plasma discharge are sprayed from the nozzle portion 20.

A silicon wafer W is designed to be held by the electrostatic force of a chuck 40 in a chamber 4 when placed on the chuck 40. The chamber 4 is provided with a vacuum pump 41. The vacuum pump 41 may be used to make the inside of the chamber 4 a vacuum. Further, a hole 42 is formed in the center of the top surface of the chamber 4. The nozzle portion 20 of the alumina discharge tube 2 is inserted through this hole 42 into the chamber 4. An 0-ring 43 is attached between the hole 42 and the alumina discharge tube 2 so as to hold the space between the hole 42 and the alumina discharge tube 2 air-tight. Further, a duct 44 is provided around the nozzle portion 20 inserted into the hole 42. By driving the vacuum pump 45, the reaction gas at the time of etching is exhausted to the outside of the chamber 4.

The X-Y drive 5 is arranged inside the chamber 4 and supports the chuck 40 from below.

The X-Y drive 5 makes the chuck 40 move in the lateral direction in FIG. 1 by an X-drive motor 50 and makes the chuck 40 and the X-drive motor 50 move together in the direction perpendicular to the surface of the paper on which FIG. 1 is drawn by a Y-drive motor 51. That is, it is possible to make the nozzle portion 20 move in the X-Y direction relative to the silicon wafer W by the X-Y drive 5.

A Z-drive 6 supports the X-Y drive 5 as a whole in the chamber 4 from below. The Z-drive 6 makes the X-Y drive 5 move in the vertical direction by a Z-drive motor 60 and enables the distance between the opening 20a of the nozzle portion 20 and the surface of the silicon wafer W to be adjusted.

Next, an explanation will be given of the working of the local etching process of this embodiment using the above local etching apparatus.

First, the vacuum pump 41 shown in FIG. 1 is driven to make the inside of the chamber 4 a predetermined low atmospheric pressure state and the Z-drive 6 is driven to raise the X-Y drive 5 as a whole and bring the silicon wafer W close to the opening 20a of the nozzle portion 20.

Figure 2:
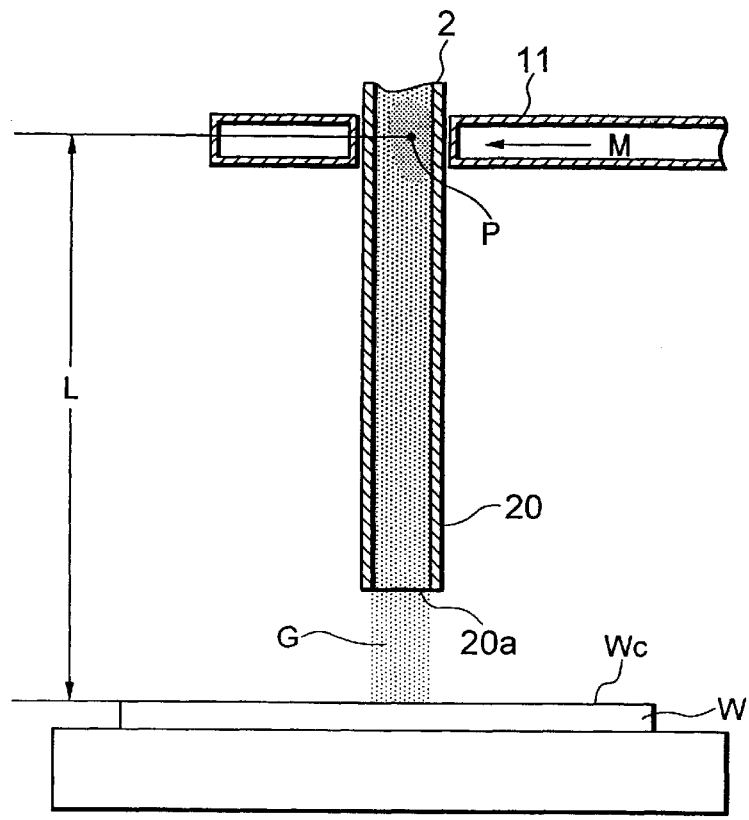
FIG. 2 is a sectional view for explaining the distance from the approximate center of a plasma discharge location to the wafer surface.

At this time, as shown in FIG. 2, the distance L from the approximate center P of the plasma discharge location of the $SF_6$ gas to the surface Wc of the silicon wafer W is set to a distance whereby the ions (charged activated species) in the activated species gas G produced by the plasma discharge of the $SF_6$ gas are extinguished by repeated collision with other ions and other particles in the activated species gas G or their lifetime. Specifically, the mean free path of ions in the activated species gas G produced by plasma discharge of the $SF_6$ gas under a pressure of 1 Torr is about $5 \times 10^{-5}$ m, so the distance is set to one larger than 3000 times the mean free path and smaller than 6000 times, that is, a distance in a range of 150 mm to 300 mm. Further, the above distance L is set so that the etching depth of the silicon wafer W by the activated species gas G sprayed on the surface Wc of the silicon wafer W becomes a value of at least 0.1 $\mu$m per second.

Next, the plasma generating step is performed.

The valve 32 of the gas feeder 3 is opened to feed the $SF_6$ gas in the gas cylinder 31 through the feed pipe 30 to the inside of the alumina discharge tube 2.

At this time, the opening degree of the valve 32 is adjusted to keep the pressure of the $SF_6$ gas at a predetermined pressure and to adjust the flow rate of the $SF_6$ gas to for example 300 sccm by the flow rate controller 33.

In parallel with the above operation of feeding the $SF_6$ gas, the microwave generator 10 is driven. The microwave M causes plasma discharge of the $SF_6$ gas and production of activated species gas G including neutral radicals, that is, F (fluorine) radicals (neutral activated species). Due to this, the activated species gas G is guided into the nozzle portion 20 of the alumina discharge tube 2 and sprayed from the opening 20a of the nozzle portion 20 to the silicon wafer W side.

The local etching step is executed in this state.

The control computer 49 is used to drive the X-Y drive 5 and make the chuck 40 holding the silicon wafer W move zigzag in the x-Y direction.

Figure 3:
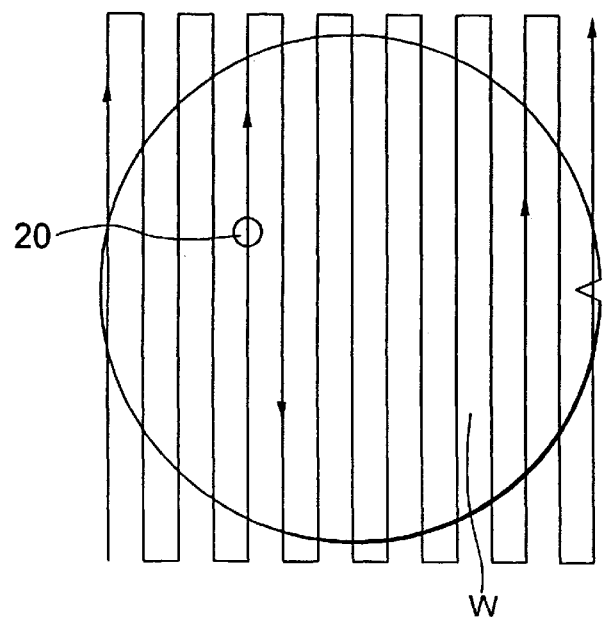
FIG. 3 is a schematic plan view showing the state of scanning of a silicon wafer by a nozzle portion.
Figure 4:
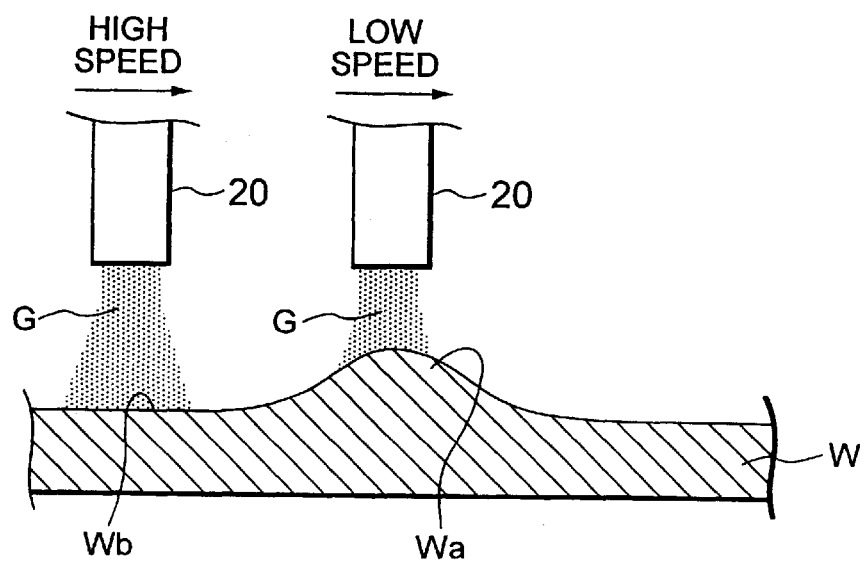
FIG. 4 is a partially enlarged sectional view of a silicon wafer for showing a local etching step.

Specifically, as shown in FIG. 3, the nozzle portion 20 is made to scan the silicon wafer W relatively in a zigzag pattern. At this time, the relative speed of the nozzle portion 20 with respect to the silicon wafer W is set so as to be substantially inversely proportional to the thickness of the relatively thick portion. Due to this, as shown in FIG. 4, the nozzle portion 20 moves directly over the non-relatively thick portion Wb at a high speed and falls in speed in accordance with the thickness of the relatively thick portion Wa when coming above the relatively thick portion Wa. As a result, the etching time of the relatively thick portion Wa becomes longer and the relatively thick portion Wa is shaved flat. The entire surface of the silicon wafer W is locally etched in this way so as to flatten the surface of the silicon wafer W.

In the above plasma generating step, a large number of ions A– are included in the activated species gas G produced at the plasma discharge location. Therefore, when the local etching step is executed, these ions A— flow down inside the alumina discharge tube 2 to the opening 20a side along with the neutral radicals F* of fluorine. These ions A− are liable to be sprayed from the opening 20a and inflict damage on the surface Wc of the silicon wafer W.

Figure 5:
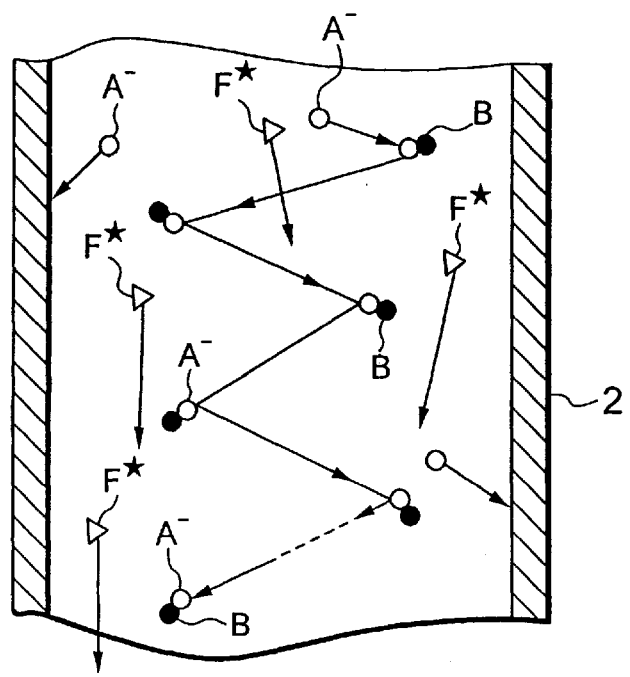
FIG. 5 is a schematic view of the state of collision of ions.
Figure 6:
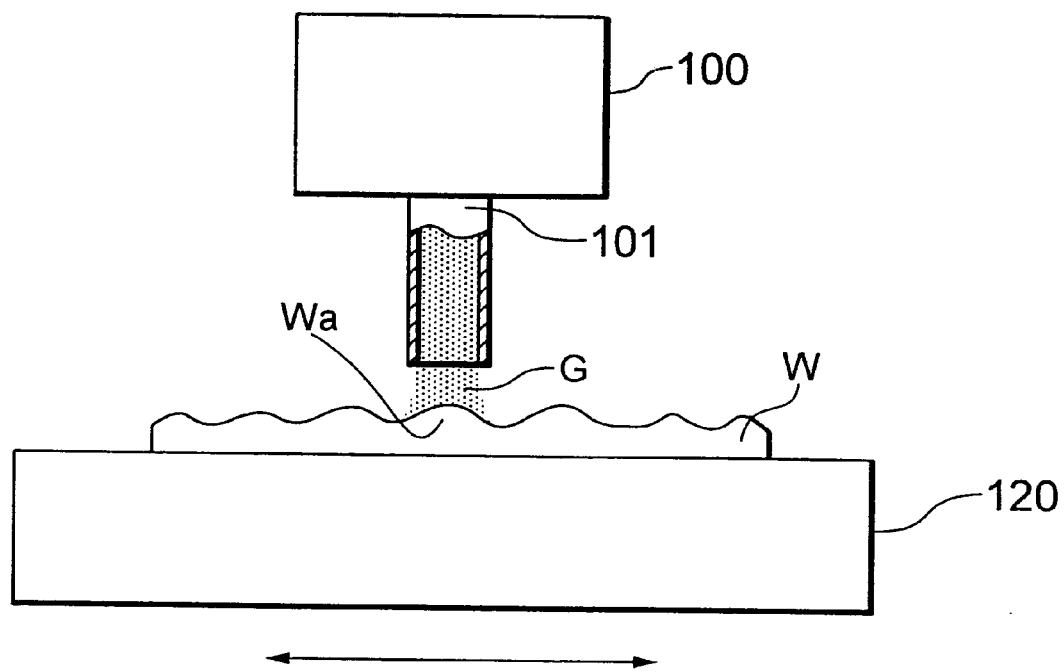
FIG. 6 is a schematic view of an example of the wafer flattening process of the related art.

In this embodiment, however, since the distance L from the approximate center P of the plasma discharge location to the surface Wc of the silicon wafer W is set to a distance in the range of 150 mm to 300 mm, as shown in FIG. 5, the number of collisions of the ions A− with the inside wall of the alumina discharge tube 2 and other particles B becomes greater. Therefore, the ions A− are extinguished before being sprayed from the opening 20a of the nozzle portion 20. As a result, only activated species gas G containing neutral radicals F* superior in direct progression not being extinguished by collision and not containing ions A− is sprayed on the surface Wc of the silicon wafer W. Therefore, the surface Wc of the silicon wafer W is not damaged and is etched by the neutral radicals F*. Further, since the distance is set to a value whereby the etching depth of the silicon wafer W by the activated species gas G becomes at least 0.1 μm per second, the high density neutral radicals F* are sprayed on to the surface Wc of the silicon wafer W and a predetermined etching rate can be secured.

In this way, according to the wafer flattening process of this embodiment, since it is possible to spray only activated species gas G containing neutral radicals F* and not containing ions A− on to the surface Wc of the silicon wafer W, it is possible to reduce the micro-roughness of the silicon wafer W due to the local etching. For example, when the local etching step was performed by making the distance L from the approximate center P of the plasma discharge location to the surface Wc of the silicon wafer W smaller than a distance of the range of 150 mm to 300 mm, that is, by bringing the opening 20a of the nozzle portion 20 closer than the case of the above embodiment, the micro-roughness of the silicon wafer W was 5 Å to 10 Å. However, when the local etching step was performed by setting the distance L to the distance of the range of 150 mm to 300 mm, the micro-roughness of the silicon wafer W became 2 Å to 3 Å, that is, the micro-roughness was greatly improved.

Note that the present invention is not limited to the above embodiment. Various modifications and changes may be made within the scope of the gist of the invention.

For example, in the above embodiment, $SF_6$ gas was used, but it is also possible to use $CF_4$ (carbon tetrafluoride) gas or $NF_3$ (nitrogen trifluoride gas).

Further, while the embodiment fed solely $SF_6$ gas to the alumina discharge tube 2 of the local etching apparatus, it is also possible to feed a mixed gas of $SF_6$ gas and $O_2$ gas or other gas to the alumina discharge tube 2. Further, it is possible to use a mixed gas of $CF_4$ and other gas or a mixed gas of $NF_3$ and another gas etc.

Further, in the above embodiment, an alumina discharge tube 2 was used as the discharge tube, but any of a quartz discharge tube or an aluminum nitride discharge tube may be used instead of the alumina discharge tube 2 to obtain similar results.

Further, in the above embodiment, the plasma generator used was a plasma generator 1 producing plasma by generating a microwave, but any means able to produce an activated species gas may be used. For example, it is of course possible to use a plasma generator producing plasma by a high frequency so as to produce activated species gas or other various types of plasma generators.

As explained above in detail, according to the wafer flattening process of the present invention, since the distance from the approximate center of the plasma discharge location of a predetermined gas to the surface of the wafer is set to at least a distance whereby the ions in the activated species gas are extinguished by repeated collision in the activated species gas, the ions are extinguished before reaching the wafer surface and only the neutral radicals are sprayed on the wafer surface. As a result, ions almost never reach the wafer surface. Only neutral radicals reach the wafer surface and contribute to the etching, so the micro-roughness of the wafer is improved. Further, since the distance is set to one whereby the etching depth of the wafer becomes substantially a desired value, it is possible to obtain the desired etching shape. That is, the present invention has the superior effect of enabling improvement of the micro-roughness of the wafer while maintaining the desired etching shape.

What is claimed is:

1. A wafer flattening process comprising:

a plasma generating step for causing plasma discharge of a gas in a discharge tube to produce an activated species gas and spraying that activated species gas from a nozzle of the discharge tube, wherein the gas is one of a gas of a halogen compound or a mixed gas including a halogen compound; and a local etching step for locally etching a relatively thick portion present on the surface of a wafer by the activated species gas sprayed from the nozzle while moving the nozzle of the discharge tube relatively along the surface of the wafer, wherein the distance from a center of a plasma discharge location of the gas to the surface of the wafer is a distance larger than 3000 times the mean free path of the ions produced in the activated species gas and smaller than 6000 times said mean free path, whereby the ions in the activated species gas are extinguished by repeated collision within the activated species gas or their lifetime and whereby the wafer is etched to an etching depth.

2. A wafer flattening process as set forth in claim 1, wherein the halogen compound is one of sulfur hexafluoride, carbon tetrafluoride, or nitrogen trifluoride.

* * * * *